(12) United States Patent
Hamann et al.

(10) Patent No.: US 9,627,604 B2
(45) Date of Patent: Apr. 18, 2017

(54) TUBULAR SPRING FOR RECEIVING AND PRETENSIONING AN ACTUATOR

(75) Inventors: Christoph Hamann, Thalmassing (DE); Jürgen Dick, Laaber (DE)

(73) Assignee: CONTINENTAL AUTOMOTIVE GMBH, Hannover (DE)

( * ) Notice: Subject to any disclaimer, the term of this patent is extended or adjusted under 35 U.S.C. 154(b) by 948 days.

(21) Appl. No.: 13/823,533

(22) PCT Filed: Aug. 26, 2011

(86) PCT No.: PCT/EP2011/064709
§ 371 (c)(1),
(2), (4) Date: May 28, 2013

(87) PCT Pub. No.: WO2012/034837
PCT Pub. Date: Mar. 22, 2012

(65) Prior Publication Data
US 2014/0145563 A1    May 29, 2014

(30) Foreign Application Priority Data
Sep. 14, 2010   (DE) .......... 10 2010 040 773

(51) Int. Cl.
*H01L 41/09* (2006.01)
*H01L 41/00* (2013.01)
(Continued)

(52) U.S. Cl.
CPC .......... *H01L 41/0536* (2013.01); *F16F 1/028* (2013.01); *H01L 41/0838* (2013.01); *F02M 51/0603* (2013.01)

(58) Field of Classification Search
USPC ............................................ 310/311–371, 26
See application file for complete search history.

(56) References Cited

U.S. PATENT DOCUMENTS 2,171,185 A    8/1939   Eugen ........................ 267/217
6,135,234 A *  10/2000  Harris et al. .................. 181/106
(Continued)

FOREIGN PATENT DOCUMENTS

DE              2501397 A1   11/1975   ............... F16F 1/02
DE         102004011455 A1   12/2004   ............. F02M 51/06
(Continued)

OTHER PUBLICATIONS

International Search Report and Written Opinion, Application No. PCT/EP2011/064709, 15 pages, Dec. 21, 2011.
(Continued)

*Primary Examiner* — Thomas Dougherty
(74) *Attorney, Agent, or Firm* — Slayden Grubert Beard PLLC (57) ABSTRACT

A tubular spring is provided for receiving and pretensioning a piezoelectric or magnetostrictive actuator of an actuator unit, e.g., for actuating a fuel injector valve in internal combustion engines, wherein the tubular spring comprises at least two types of recesses, each comprising different maximum lateral extensions in the longitudinal direction of the tubular spring. The tubular spring is designed to comprise a uniform load distribution about the circumference of the tubular spring even without welding the longitudinal sides thereof abutting one another.

20 Claims, 5 Drawing Sheets (51) Int. Cl.
*H01L 41/053* (2006.01)
*F16F 1/02* (2006.01)
*H01L 41/083* (2006.01)
*F02M 51/06* (2006.01)

(56) References Cited

U.S. PATENT DOCUMENTS

| | | | |
|---|---|---|---|
| 6,494,288 B1 * | 12/2002 | Tashiro et al. | 181/102 |
| 6,984,924 B1 | 1/2006 | Voigt et al. | 310/348 |
| 7,420,316 B2 | 9/2008 | Kienzler et al. | 310/311 |
| 7,564,175 B2 | 7/2009 | Stier et al. | 310/348 |
| 2006/0113870 A1 * | 6/2006 | Kienzler et al. | 310/328 |

FOREIGN PATENT DOCUMENTS

| | | | | |
|---|---|---|---|---|
| DE | 10344621 A1 | 5/2005 | | F02M 51/06 |
| EP | 1605159 A1 | 12/2005 | | F02M 61/20 |
| GB | 2224317 A | 5/1990 | | F02M 57/02 |
| RU | 2093805 | * 10/1997 | | G01L 7/04 |
| WO | 00/08353 A1 | 2/2000 | | F16F 1/02 |
| WO | 2004/097208 A1 | 11/2004 | | F02M 47/02 |
| WO | 2012/034837 A1 | 3/2012 | | F02M 59/46 |

OTHER PUBLICATIONS

German Office Action, Application No. 102010040773.9, 7 pages, Oct. 15, 2015.

European Office Action, Application No. 11748952.6, 5 pages, Nov. 18, 2016.

* cited by examiner

TUBULAR SPRING FOR RECEIVING AND PRETENSIONING AN ACTUATOR

CROSS-REFERENCE TO RELATED APPLICATIONS

This application is a U.S. National Stage Application of International Application No. PCT/EP2011/064709 filed Aug. 26, 2011, which designates the United States of America, and claims priority to DE Application No. 10 2010 040 773.9 filed Sep. 14, 2010, the contents of which are hereby incorporated by reference in their entirety.

TECHNICAL FIELD

The disclosure relates to a tubular spring for receiving and preloading a piezoelectric or magnetostrictive actuator and to an actuator unit having a corresponding tubular spring.

BACKGROUND

Piezoelectric or magnetostrictive actuators are usually used in actuator units in the motor vehicle industry in order, for example, to actuate fuel injector valves of internal combustion engines. To avoid or at least reduce tensile and/or shear forces, such actuators are generally preloaded by a spring. Such springs are usually designed as tubular springs, which serve as hollow bodies for receiving the actuator.

A corresponding tubular spring is known from WO 00/08353 A1, for example. The tubular spring shown there is designed as an elastic hollow body which preloads the piezoelectric actuator situated therein. The hollow body is provided with apertures, which are of bone-shaped design and extend transversely to the axis of the hollow body. The tubular spring is manufactured from spring steel strip, from which the apertures are first of all punched out, after which individual blanks are cut from the spring steel strip to the desired size for the tubular spring. The blanks are then rolled to give two abutting edges resting against one another in the longitudinal direction of the tubular spring. To fix the tubular spring, said abutting edges are welded or are fixed in such a way by means of upper and lower cover plates that the abutting edges rest against one another. Particularly in the case of unwelded abutting edges resting against one another, nonuniform loads and deformations may occur in the tubular spring.

DE 10 344 621 A1 has disclosed a tubular spring which likewise has bone-shaped apertures perpendicularly to the longitudinal axis of the tubular spring, said apertures being spaced apart by webs between the apertures. Depending on their position, the webs have different spacings, ensuring that nonuniform mechanical loads on the tubular spring, especially those starting from the two unwelded abutting edges, are distributed as uniformly as possible to the structure of the tubular spring in the circumferential direction.

Starting from the two abutting edges of the tubular spring, especially when said edges are not welded, there are not only nonuniform loads and deformations along the circumference of the tubular spring but also in the longitudinal direction thereof, however, and therefore distribution of nonuniform transverse forces in the circumferential direction of the tubular spring, as shown in DE 10 344 621, compensates for only some of the nonuniform loads which occur within the tubular spring.

SUMMARY

One embodiment provides a tubular spring for receiving and preloading a piezoelectric or magnetostrictive actuator of an actuator unit which is suitable, in particular, for actuating a fuel injector valve for internal combustion engines, having a plurality of rows of apertures, each extending from the outer surface of the tubular spring to the inner surface thereof, wherein the apertures have respective cross-sectional contour lines on each of the two surface sides, and said cross-sectional contour lines in each case define a maximum longitudinal extent of an aperture and a maximum transverse extent oriented substantially perpendicularly to the longitudinal extent, wherein at least the respective transverse extents of two apertures on the same of the two surfaces of the tubular spring differ from one another.

In a further embodiment, the cross-sectional contour lines of the apertures are in each case rounded at the two ends of the apertures in the longitudinal direction.

In a further embodiment, the cross-sectional contour lines of the apertures at each of the two ends in the longitudinal direction can be described by respective radii.

In a further embodiment, the apertures of different transverse extents correspondingly have different radii at the ends thereof.

In a further embodiment, the tubular spring has two abutting edges, which are associated with one another and extend over the entire length of the hollow body, and apertures of different transverse extents are arranged along the abutting edges, extending across the abutting edges.

In a further embodiment, two or more apertures, each of different transverse extents, are arranged at least within one row.

In a further embodiment, at least two or more apertures alternate along the axis of the row.

In a further embodiment, the tubular spring is manufactured from metal, in particular from spring steel, and the apertures are punched in.

BRIEF DESCRIPTION OF THE DRAWINGS

Exemplary embodiments will be explained in more detail below based on the schematic drawings, wherein.

DETAILED DESCRIPTION

Some embodiments of the present disclosure provide a tubular spring for receiving and for preloading a piezoelectric or magnetostrictive actuator of an actuator unit which is suitable, in particular, for actuating a fuel injector valve for internal combustion engines and in which nonuniform loads and deformations in the tubular spring, both in the longitudinal and the transverse direction thereof, are minimized.

In some embodiments, the tubular spring has a number of apertures, which are normally punched out of a spring steel blank. After the spring has been rolled, the apertures extend from the outer surface of the tubular spring to the inner surface. Each aperture has a cross-sectional contour line at one of the two surfaces, the outer surface or the inner surface. On one surface side in each case, the cross-sectional contour line defines a respective maximum longitudinal extent of the aperture and a respective maximum transverse extent, the transverse extent being oriented substantially perpendicularly to the longitudinal extent. Depending on the punching tool used and the punching method used, the cross-sectional contour lines on the outer surface and on the inner surface may not be congruent in a common plane of projection, with the result that the maximum longitudinal extent and/or the maximum transverse extent of the aperture on the outer surface differs from that on the inner surface.

In some embodiments, however, the transverse extents of two apertures already differ from one another on the same of the two surfaces of the tubular spring. In this way, it is possible to structurally reinforce or weaken areas of the tubular spring in order to distribute the loads and deformations within the tubular spring more uniformly, both over the circumference and along the longitudinal axis of the tubular spring. At the same time, the web width between the individual apertures in the transverse direction can be kept constant.

The maximum longitudinal extent of an aperture is usually oriented at least substantially transversely to the axis of the tubular spring.

The cross-sectional contour lines of the apertures may be rounded at the respective ends in the longitudinal direction and can be described by a radius. Since the apertures may be produced first of all by punching the apertures out of a spring steel blank, rounded aperture ends that can be described by a radius are particularly easy to produce since fewer dimensional errors due, for example, to punching burrs can occur in comparison with, for example, angled ends.

The apertures of different transverse extents may also correspondingly have different radii at the ends thereof in the longitudinal direction. An aperture with a relatively large transverse extent accordingly has a larger radius at the longitudinal end thereof than an aperture of relatively small transverse extent.

It is advantageous if two or more apertures, each of different transverse extents, are arranged within one row of apertures in order to equalize nonuniform loads in the tubular spring over the extent of the tubular spring, at least in the circumferential direction. Two or more apertures, each of different transverse extents, may be arranged in a plurality of rows of apertures, allowing nonuniform transverse and longitudinal loads in the tubular spring to be distributed uniformly in the best possible way over the entire structure of the tubular spring.

The at least two or more apertures may alternate along a row of apertures.

Since the nonuniform loads in the tubular spring, in particular, are distributed over the tubular spring, starting from the two abutting edges, it may furthermore be advantageous if those apertures which extend across the abutting edges and consequently are divided by the two abutting edges in each case in the cross-sectional extents thereof along the axis of the tubular spring. For example, successive apertures along the abutting edges can alternately have different end radii in the longitudinal direction of the tubular spring. In this way, nonuniform loading introduced into the tubular spring at the abutting edges is distributed in a particularly effective manner as uniformly as possible along the entire longitudinal direction of the tubular spring, even at the location where it arises.

Figure 1:
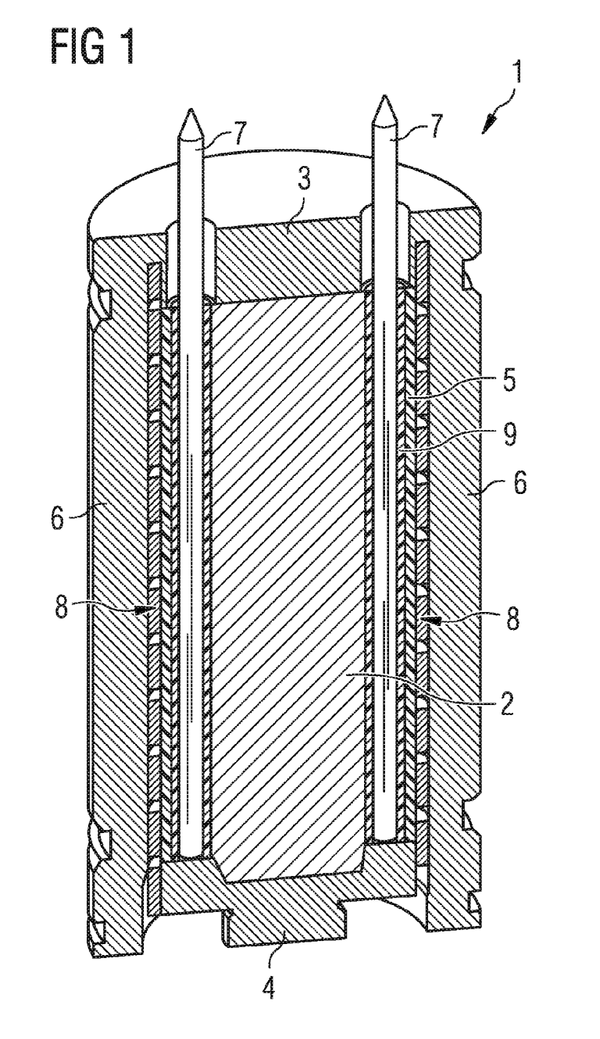
FIG. 1 shows a section through a piezoelectric actuator unit.

FIG. 1 shows a section through a piezoelectric actuator unit 1, which can be used, in particular, as a drive unit for actuating an injector nozzle in a fuel injector. The piezoelectric actuator unit 1 has an actuator module 2 which is constructed from several hundred piezoelectric ceramic layers in the form of a stack-type actuator. Arranged between each pair of ceramic layers is an inner electrode, said electrodes being connected alternately in an electrically conductive manner to two outer electrodes extending vertically on the outer wall of the actuator module 2. Two contact pins 7 are furthermore arranged parallel to the two outer electrodes, said pins being brought into contact with the two outer electrodes by means of corresponding lines. For assembly, the actuator module 2 is inserted, with the two contact pins 7 wired up, into a plastic sleeve (assembly sleeve) 5 and fixed. The plastic sleeve 5 is simultaneously designed as a casting mold, in which the inserted components 2, 7 are encapsulated with a potting compound 9, e.g. with a potting silicone, elastomer or the like. The plastic sleeve 5 is manufactured from a plastic, e.g. from a PA plastic (polyamide).

A top plate 3 is arranged at an upper end of the actuator module 2, being connected nonpositively to the actuator module 2. The top plate 3 thus delimits the actuator module 2 at the top. Two insulated bushings in the top plate 3 for the two contact pins 7 are embodied in such a way that the projecting ends of the two contact pins 7 can subsequently be connected to a control voltage of a corresponding control unit in order to supply the actuator module 2 with electric power.

The lower end of the actuator module 2 is delimited by a bottom plate 4, which is likewise connected nonpositively to the actuator module 2. A tubular spring 8 is arranged in the form of a sleeve between the top plate 3 and the bottom plate and surrounds the potted actuator module 2. The tubular spring 8 is mounted with a preloading force which acts as a restoring force on the actuator module 2 and thus assists return of the actuator module 2 into the home position thereof when said module is not activated.

The entire subassembly is encased in the manner of a sleeve by an actuator housing 6. In this case, the upper end of the actuator housing 6 is connected securely and in a sealing manner to the top plate 3. The lower end of the actuator housing 6, in contrast, is arranged in such a way that it can move axially relative to the bottom plate 4 but is likewise sealed off in a fuel-tight manner. When the actuator module 2 is activated, a slight axial stroke motion thus arises between the bottom plate 4 and the underside of the actuator housing 6, and this can be used to control a servo valve, a nozzle needle or the like.

Figure 2A:
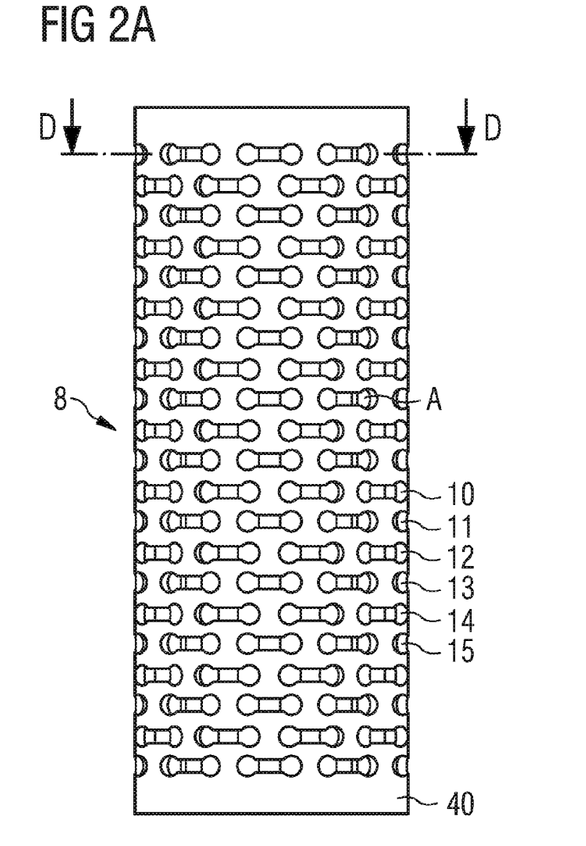
FIG. 2A shows an embodiment of a known hollow body for preloading a piezoelectric actuator as a tubular spring.
Figure 2B:
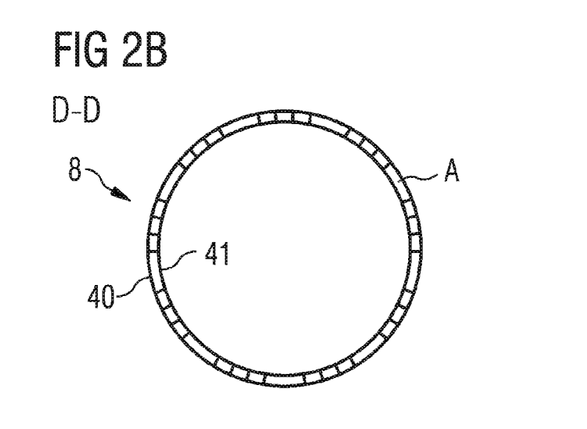
FIG. 2B shows a sectional view of the tubular spring shown in FIG. 2A.

FIGS. 2A and 2B show the construction of a known tubular spring 8. Apart from the edge regions, on which the cover plates 3, 4 are secured, the tubular spring has uniformly distributed apertures A over its entire surface, said apertures being bone-shaped in the illustrative embodiment shown and extending through the tubular spring transversely to the axis. The apertures A ensure adequate elasticity of the tubular spring 8 receiving the preloaded piezoelectric actuator 2, with the result that the tubular spring only slightly hinders the elongation of the actuator 2 in the longitudinal direction caused by application of a voltage to the piezoelectric actuator 2. Here, the elasticity of the tubular spring 2 can be adapted to the desired elongation of the preloaded piezoelectric actuator 2 by means of the number and length of the apertures A.

The offset arrangement of the apertures A, one above the other, which is shown in FIGS. 2A and 2B is also advantageous here. This arrangement ensures optimum elasticity of the tubular spring with, at the same time, sufficient strength to be able to apply the preload to the piezoelectric actuator 2. In particular, the elasticity is also promoted by the bone-shaped form of the apertures A in this illustrative embodiment, in which two circular apertures are connected to one another by a slot. Example size ranges for the circular apertures are given by diameters of 0.8 mm to 1.6 mm and spacings between the centers of the apertures in a range of from 1.5 mm to 3.5 mm. Moreover, this shape can be formed very easily and accurately, e.g. by punching, in a spring steel sheet.

The tubular spring may be manufactured from a spring steel strip with a thickness of 0.5 mm. In a first step, the apertures A are punched into the spring steel strip. As an alternative, there is also the possibility of forming the apertures by wire erosion, milling or boring or by an electrochemical method.

After the formation of the apertures A, the spring steel strip is cut to the desired size for the tubular spring 8, the apertures A preferably being cut through centrally during this process. The blank is then rolled, with the cut or punched edges being oriented outward. The edges are then deburred, and the tubular shape is then fixed with a longitudinal weld seam preferably produced by means of a laser. Instead of fixing the tubular shape by welding, fixing can also be accomplished by means of the upper and lower cover plates 3, 4, with the result that the abutting edges merely rest against one another.

FIG. 2B shows a sectional representation of the tubular spring 8 shown in FIG. 2A. An aperture A and the outer surface 40 and inner surface 41 of the tubular spring 8 are illustrated by way of example.

Figure 3:
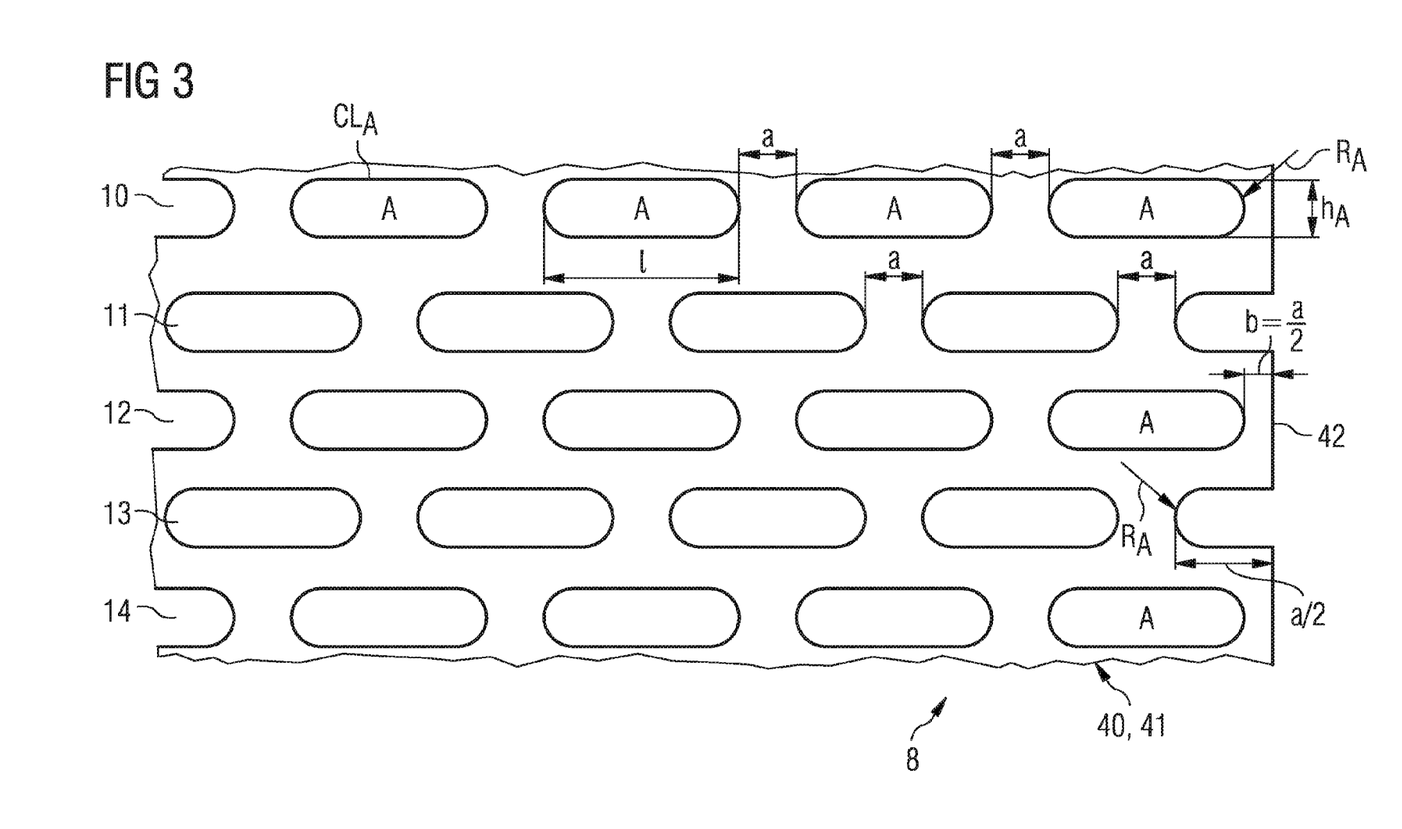
FIG. 3 shows a detail of a known tubular spring in the unrolled state.

FIG. 3 shows a detail of a known tubular spring 8 in the unrolled state. An alternative embodiment of the apertures A to that in FIGS. 2A and 2B, in which the apertures A have a rectangular basic shape which is rounded at both ends of the apertures A and, at that point, can be described by a radius $R_A$, is shown. The outline of the apertures A is described on each of the surfaces 41, 42 by the cross-sectional contour line CL of the apertures. Consequently, the cross-sectional contour line CL merges into the radius $R_A$ at the two ends of the apertures A.

The cross-sectional contour line CL defines a maximum transverse extent $h_A$ of the apertures A perpendicularly to the longitudinal orientation of the apertures A. In the circumferential direction of the tubular spring 8, the apertures A are arranged spaced apart by webs of width a, it being possible, in particular, also for the web width a to be constant; as an alternative, however, it can also be variable.

An abutting edge 42 of the tubular spring 8 is likewise illustrated. Here, the longitudinal extent of the apertures A may be cut in half, with the result that the two half apertures each form one aperture A across the abutting edge in the finished tubular spring 8; and are thus identical to the other apertures A, which are not arranged at the abutting edge.

The illustrated embodiment of a tubular spring 8 has just one type of aperture A, each of the apertures having both the same maximum longitudinal extent 1 and a maximum transverse extent $h_A$.

Figure 4:
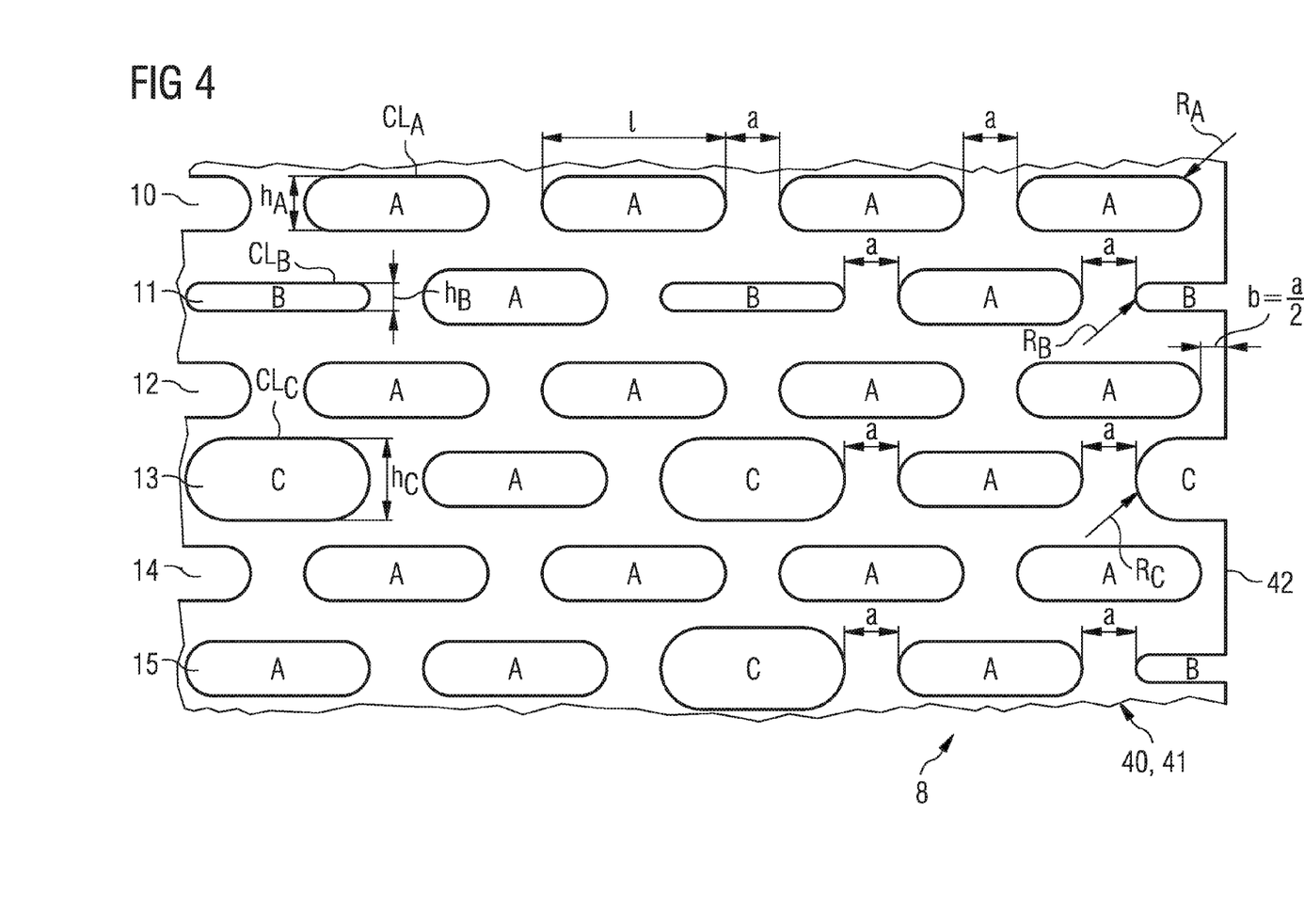
FIG. 4 shows a first embodiment of a tubular spring according to one embodiment.

In an illustration similar to FIG. 3, FIG. 4 shows a first embodiment of a tubular spring 8 according to one embodiment. It illustrates apertures A of the first type with a maximum transverse extent $h_A$ in rows 10, 12, 14, each distributed along the circumference of an outer or inner surface 41, 42 of the tubular spring 8. According to this embodiment of the tubular spring 8, apertures B with a maximum transverse extent $h_B$, are also arranged along the circumference of the tubular spring, in row 11, in addition to apertures A. The apertures A and B alternate with each other around the spring, with two corresponding half apertures forming an aperture B across the abutting edges.

Each of the apertures B is also rounded at the longitudinal ends thereof. The rounding can be described by a radius $R_B$, which is smaller than the corresponding radius $R_A$ of an aperture of type A. In addition, apertures of a type C are additionally arranged in the tubular spring 8, in row 13 for example, the maximum transverse extent $h_e$ of said apertures being greater than the maximum transverse extent $h_A$ of the apertures of type A. These apertures B are also arranged along the circumference of the tubular spring 8 (on the outer surface 41 or the inner surface 42), in each case alternating with apertures of type A. Similarly to the arrangement in row 11, an aperture of type C is also arranged across the abutting edge 42 in row 13.

The apertures of type C also have rounded end regions, which can be described by a radius $R_C$, where $R_C > R_A$.

Apertures of all three illustrated types A, B and C are arranged in row 15.

Figure 5:
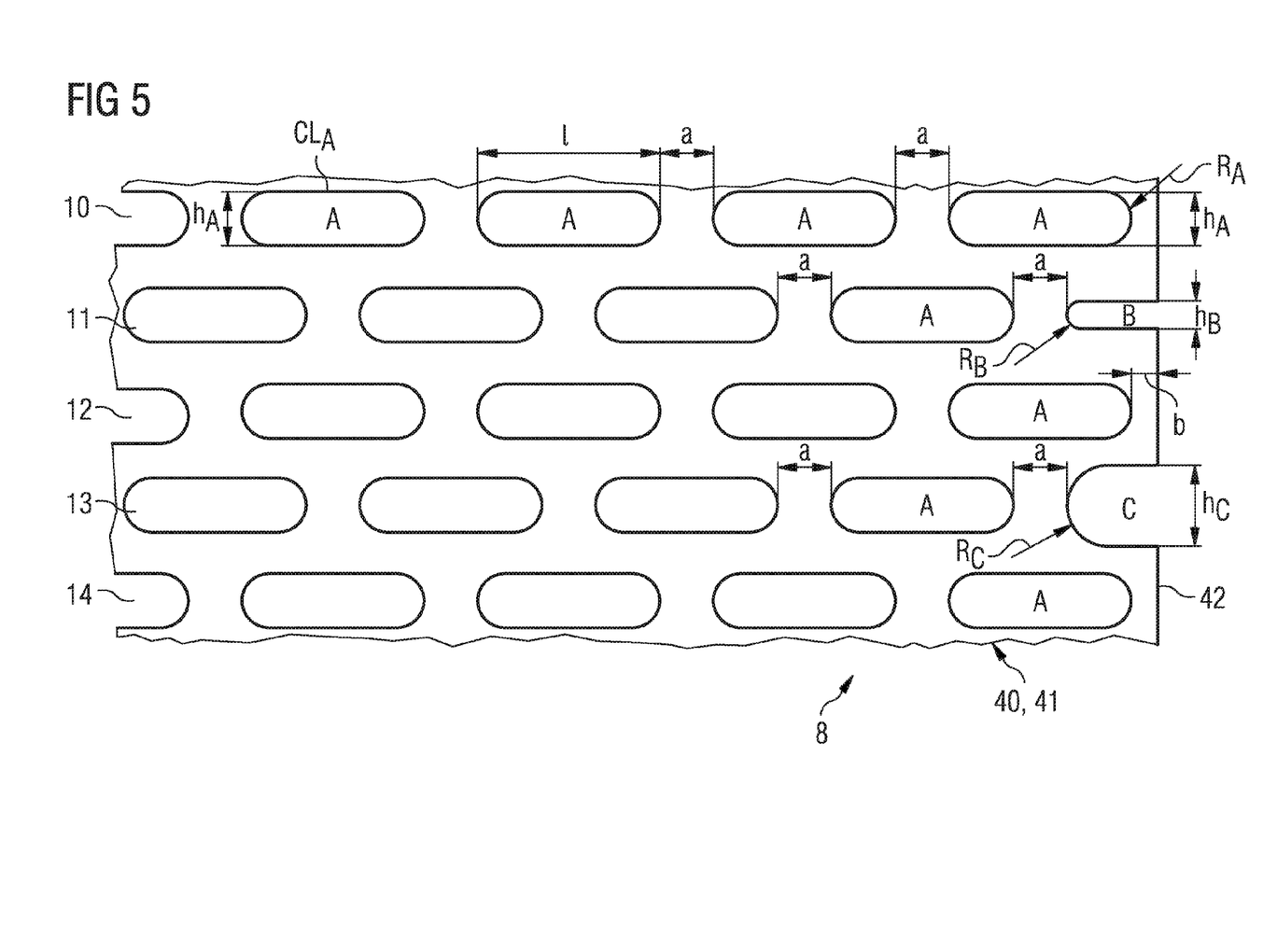
FIG. 5 shows a second embodiment of a tubular spring according to one embodiment.

FIG. 5 shows an alternative embodiment of a tubular spring 8 according to one embodiment. In this embodiment, apertures of types B and C are arranged only across the abutting edge 42. In the illustration in FIG. 5, this applies only to rows 11 and 13, in which apertures B and C, respectively, are arranged across the abutting edge 42. Otherwise, the tubular spring 8 according to this embodiment has only apertures of type A on each surface side 40, 41. By arranging apertures of different types across the abutting edge 42, the nonuniform loads introduced at the abutting edges are distributed over the tubular spring 8 as uniformly as possible in the longitudinal and transverse direction of the tubular spring 8, even at the location where they arise.

However, embodiments are, of course, not restricted to the two embodiments in FIGS. 4 and 5. As an alternative, it is also possible for other arrangements of apertures with different maximum transverse extents to be implemented in a tubular spring 8, e.g. it is also possible for more than three apertures of different types, each with a different maximum transverse extent, to be used in accordance with this invention.

What is claimed is:

1. A tubular spring for receiving and preloading a piezoelectric or magnetostrictive actuator of an actuator unit of a fuel injector valve of an internal combustion engine, the tubular spring comprising:
    a cylindrical sleeve having an inner surface, an outer surface, and a longitudinal axis extending along a length of the cylindrical sleeve,
    a plurality of apertures arranged in rows, each aperture extending from the outer surface of the cylindrical sleeve to the inner surface thereof,
    wherein the plurality of apertures comprise multiple different aperture types,
    wherein each aperture defines a cross-sectional contour line on each of the outer surface and the inner surface of the tubular spring, and
    wherein for each aperture type, the cross-sectional contour lines of the apertures of that aperture type define:
        a maximum aperture height extending parallel to the longitudinal axis of the cylindrical sleeve, and
        a maximum aperture width extending transverse to the longitudinal axis of the cylindrical sleeve,
    wherein the respective maximum aperture height of at least two of the aperture types differ from each other and the maximum aperture width is greater than the maximum aperture height for each aperture.

2. The tubular spring of claim 1, wherein the cross-sectional contour lines of each aperture are rounded at both ends of the aperture.

3. The tubular spring of claim 2, wherein the cross-sectional contour lines of each aperture at each of the two longitudinal ends are defined by respective radii.

4. The tubular spring of claim 3, wherein the apertures of at least two different aperture types have different radii at the longitudinal ends thereof.

5. The tubular spring of claim 1, wherein the cylindrical sleeve comprises two abutting edges associated with one another and extend over an entire length of the hollow body, and
wherein apertures of aperture types having different aperture heights are arranged along the abutting edges and extending across the abutting edges.

6. The tubular spring of claim 1, wherein two or more apertures having different heights are arranged within the same row.

7. The tubular spring of claim 1, wherein a particular row includes apertures of multiple different apertures types arranged in an alternating manner.

8. The tubular spring of claim 1, wherein the tubular spring is formed from metal.

9. The tubular spring of claim 8, wherein the tubular spring is formed from spring steel.

10. The tubular spring of claim 8, wherein the apertures are punched in the metal.

11. A piezoelectric actuator unit for actuating an injector nozzle in a fuel injector, the piezoelectric actuator unit comprising:
an actuator module;
a tubular spring configured to receive and preload the actuator module, the tubular spring comprising:
a cylindrical sleeve having an inner surface, an outer surface, and a longitudinal axis extending along a length of the cylindrical sleeve,
a plurality of apertures arranged in rows, each aperture extending from the outer surface of the cylindrical sleeve to the inner surface thereof,
wherein the plurality of apertures comprise multiple different aperture types,
wherein each aperture defines a cross-sectional contour line on each of the outer surface and the inner surface of the tubular spring, and
wherein for each aperture type, the cross-sectional contour lines of the apertures of that aperture type define:
a maximum aperture height extending parallel to the longitudinal axis of the cylindrical sleeve, and
a maximum aperture width extending tranverse to the longitudinal axis of the cylindrical sleeve,
wherein the respective maximum aperture height of at least two of the aperture types differ from each other and the maximum aperture width is greater than the maximum aperture height for each aperture.

12. The piezoelectric actuator unit of claim 11, wherein the cross-sectional contour lines of each aperture are rounded at both ends of the aperture.

13. The piezoelectric actuator unit of claim 12, wherein the cross-sectional contour lines of each aperture at each of the two longitudinal ends are defined by respective radii.

14. The piezoelectric actuator unit of claim 13, wherein the apertures of at least two different aperture types have different radii at the longitudinal ends thereof.

15. The piezoelectric actuator unit of claim 11, wherein the cylindrical sleeve comprises two abutting edges associated with one another and extend over an entire length of the hollow body, and
wherein apertures of aperture types having different aperture heights are arranged along the abutting edges and extending across the abutting edges.

16. The piezoelectric actuator unit of claim 11, wherein two or more apertures having different heights are arranged within the same row.

17. The piezoelectric actuator unit of claim 11, wherein a particular row includes apertures of multiple different apertures types arranged in an alterating manner.

18. The piezoelectric actuator unit of claim 11, wherein the tubular spring is formed from metal.

19. The piezoelectric actuator unit of claim 18, wherein the tubular spring is formed from spring steel.

20. The piezoelectric actuator unit of claim 18, wherein the apertures are punched in the metal.

* * * * *